United States Patent
Maruyama et al.

(10) Patent No.: US 11,548,985 B2
(45) Date of Patent: Jan. 10, 2023

(54) SILOXANE POLYMER CONTAINING ISOCYANURIC ACID AND POLYETHER SKELETONS, PHOTOSENSITIVE RESIN COMPOSITION, PATTERN FORMING PROCESS, AND FABRICATION OF OPTO-SEMICONDUCTOR DEVICE

(71) Applicant: Shin-Etsu Chemical Co., Ltd., Tokyo (JP)

(72) Inventors: Hitoshi Maruyama, Annaka (JP); Kyoko Soga, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 72 days.

(21) Appl. No.: 16/676,591

(22) Filed: Nov. 7, 2019

(65) Prior Publication Data

US 2020/0165394 A1 May 28, 2020

(30) Foreign Application Priority Data

Nov. 28, 2018 (JP) .............................. JP2018-221908
Apr. 26, 2019 (JP) .............................. JP2019-084933

(51) Int. Cl.
| | | |
|---|---|---|
| *C08G 77/52* | (2006.01) | |
| *C08G 77/18* | (2006.01) | |
| *G03F 7/004* | (2006.01) | |
| *G03F 7/075* | (2006.01) | |
| *C08G 77/00* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |

(52) U.S. Cl.
CPC ............. *C08G 77/52* (2013.01); *C08G 77/18* (2013.01); *G03F 7/0045* (2013.01); *G03F 7/0757* (2013.01); C08G 77/80 (2013.01); G03F 7/162 (2013.01); G03F 7/168 (2013.01); G03F 7/2004 (2013.01); G03F 7/325 (2013.01); G03F 7/38 (2013.01)

(58) Field of Classification Search
CPC ........ G03F 7/039; G03F 7/004; G03F 7/0045; G03F 7/0757; G03F 7/162; G03F 7/168; G03F 7/2004; G03F 7/325; G03F 7/38; G03F 7/20; G03F 7/0382; G02F 1/1333; C08G 77/52; C08G 77/18; C08G 77/80; C08G 77/26; C08G 77/50; C08G 77/14; C08G 77/24; C08G 77/54; C09D 183/14; C09D 183/06; H05K 3/287; H05K 3/281; Y10T 428/24537; Y10T 428/24339
See application file for complete search history.

(56) References Cited

U.S. PATENT DOCUMENTS

| | | |
|---|---|---|
| 4,470,831 A | 9/1984 | Hirose |
| 4,990,546 A | 2/1991 | Eckberg |
| 5,240,971 A | 8/1993 | Eckberg et al. |
| 5,346,980 A | 9/1994 | Babu |
| 5,750,589 A | 5/1998 | Zech et al. |
| 6,072,016 A | 6/2000 | Kobayashi et al. |
| 6,590,010 B2 | 7/2003 | Kato et al. |
| 7,785,766 B2 | 8/2010 | Kato et al. |
| 8,697,333 B2 | 4/2014 | Soga et al. |
| 8,715,905 B2 | 5/2014 | Tagami et al. |
| 8,729,148 B2 | 5/2014 | Asai et al. |
| 8,796,410 B2 | 8/2014 | Sugo et al. |
| 8,889,810 B2 | 11/2014 | Takeda et al. |
| 9,012,111 B2 | 4/2015 | Asai et al. |
| 9,091,919 B2 | 7/2015 | Urano et al. |
| 9,122,158 B2 | 9/2015 | Asai |
| 10,503,067 B2 | 12/2019 | Maruyama et al. |
| 10,982,053 B2 | 4/2021 | Maruyama et al. |
| 2008/0182087 A1 | 7/2008 | Kato et al. |
| 2009/0156753 A1 | 6/2009 | Sugo et al. |
| 2011/0061914 A1 | 3/2011 | Sekito |
| 2011/0076465 A1 | 3/2011 | Takeda et al. |
| 2011/0077364 A1 | 3/2011 | Tazaki et al. |
| 2011/0275768 A1 | 11/2011 | Yasuda et al. |
| 2012/0108762 A1 | 5/2012 | Kondo et al. |
| 2012/0235284 A1 | 9/2012 | Sugo et al. |
| 2012/0248632 A1* | 10/2012 | Mitsukura ............... G03F 7/038 430/280.1 |
| 2013/0029145 A1 | 1/2013 | Kato et al. |

(Continued)

FOREIGN PATENT DOCUMENTS

| | | |
|---|---|---|
| EP | 0927736 A1 | 7/1999 |
| EP | 1186624 B1 | 3/2003 |

(Continued)

OTHER PUBLICATIONS

English Translation of WO 2016/076205 A1; Hitonari Matsumoto; Published: May 19, 2016 (Year: 2016).*

(Continued)

*Primary Examiner* — Peter L Vajda
*Assistant Examiner* — Richard David Champion
(74) *Attorney, Agent, or Firm* — WHDA, LLP

(57) ABSTRACT

A siloxane polymer comprising polysiloxane, silphenylene, isocyanuric acid, and polyether skeletons in a backbone and having an epoxy group in a side chain is provided. A photosensitive resin composition comprising the siloxane polymer and a photoacid generator is coated to form a film which can be patterned using radiation of widely varying wavelength. The patterned film has high transparency and light resistance.

14 Claims, No Drawings

(56) References Cited

U.S. PATENT DOCUMENTS

| | | |
|---|---|---|
| 2013/0108866 A1 | 5/2013 | Kato et al. |
| 2013/0108876 A1 | 5/2013 | Komori et al. |
| 2013/0135763 A1 | 5/2013 | Liao et al. |
| 2013/0149645 A1 | 6/2013 | Takemura et al. |
| 2013/0196114 A1* | 8/2013 | Urano .................. C09D 183/14 428/139 |
| 2013/0302983 A1 | 11/2013 | Tanabe et al. |
| 2013/0323631 A1 | 12/2013 | Asai et al. |
| 2016/0033865 A1 | 2/2016 | Takemura et al. |
| 2016/0097973 A1 | 4/2016 | Urano et al. |
| 2016/0315025 A1 | 10/2016 | Kondo et al. |
| 2017/0198102 A1 | 7/2017 | Yanaizumi et al. |
| 2017/0255097 A1 | 9/2017 | Takemura et al. |
| 2018/0004088 A1 | 1/2018 | Maruyama et al. |
| 2018/0224743 A1 | 8/2018 | Maruyama et al. |
| 2019/0049844 A1 | 2/2019 | Maruyama et al. |
| 2019/0354014 A1 | 11/2019 | Maruyama et al. |
| 2020/0165364 A1 | 5/2020 | Higuchi |
| 2020/0165394 A1 | 5/2020 | Maruyama et al. |
| 2020/0201182 A1 | 6/2020 | Hirano et al. |

FOREIGN PATENT DOCUMENTS

| | | | |
|---|---|---|---|
| EP | 1953183 A2 | 8/2008 | |
| EP | 1953183 A3 | 11/2008 | |
| EP | 2447304 A1 | 5/2012 | |
| EP | 2587530 A2 | 5/2013 | |
| EP | 4953183 B1 | 9/2013 | |
| EP | 2397508 B1 | 2/2016 | |
| EP | 3103835 A1 | 12/2016 | |
| EP | 3211661 A2 | 8/2017 | |
| EP | 3 214 497 A1 | 9/2017 | |
| EP | 3 358 412 A1 | 8/2018 | |
| JP | 8-32763 B2 | 3/1996 | |
| JP | H11-80362 A | 3/1999 | |
| JP | 2002-88158 A | 3/2002 | |
| JP | 2008-184571 A | 8/2008 | |
| JP | 2012-1668 A | 1/2012 | |
| JP | 2012-092268 A | 5/2012 | |
| JP | 2013-110391 A | 6/2013 | |
| JP | 2013-173920 A | 9/2013 | |
| JP | 2014-122276 A | 7/2014 | |
| JP | 2016-74874 A | 5/2016 | |
| JP | 2016-125032 A | 7/2016 | |
| JP | 2018-002848 A | 1/2018 | |
| JP | 2018-124552 A | 8/2018 | |
| WO | WO-2016076205 A1 * | 5/2016 | ........... G02F 1/1333 |

OTHER PUBLICATIONS

Search Report dated Dec. 19, 2018, issued in counterpart EP Application No. 18187705.1 (9 pages).

Extended European Search Report dated Sep. 20, 2019, issued in counterpart EP application No. 19172966.4. (8 pages).

Non-Final Office Action dated Aug. 24, 2020, issued in U.S. Appl. No. 16/414,281 (16 pages).

Non-Final Office Action dated Sep. 18, 2020, issued in U.S. Appl. No. 16/056,711 (14 pages).

Li et a. "Synthesis and Properties of Polymers Containing Siphenylene Moiety via Catalytic Cross-Dehydrocoupling Polymerization of 1,4-Bis(dimethylsilyl)benzene" Macromolecules, 1999, 32, 8768-8773. (Year: 1999) (6 pages).

Non-Final Action dated Sep. 14, 2021, issued in U.S. Appl. No. 16/056,629 (12 pages).

Non-Final Office Action dated Dec. 21, 2021, issued in U.S. Appl. No. 16/056,711. (11 pages).

Final Office Action dated Mar. 11, 2022, issued in U.S. Appl. No. 16/056,629. (19 pages).

Office Action dated Sep. 1, 2020, issued in JP Application No. 2017-153884 (counterpart to U.S. Appl. No. 16/056,711), with English translation. (18 pages).

Extended European Search Report dated Dec. 20, 2018, issued in U.S. Appl. No. 16/056,629 (counterpart to U.S. Appl. No. 16/056,629). (7 pages).

Non-Final Office Action dated Sep. 18, 2020, issued in U.S. Appl. No. 16/056,629. (16 pages).

Non-Final Office Action dated May 22, 2019, issued in U.S. Appl. No. 15/883,265. (9 pages).

Notice of Reasons for Refusal dated Aug. 25, 2020, issued in JP Application No. 2017-153901 (counterpart to U.S. Appl. No. 16/056,629), with English translation. (8 pages).

Non-Final Office Action dated Jun. 10, 2021, issued in U.S. Appl. No. 16/411,472. (18 pages).

Non-Final Office Action dated Jun. 24, 2021, issued in U.S. Appl. No. 16/716,821. (17 pages).

* cited by examiner

SILOXANE POLYMER CONTAINING ISOCYANURIC ACID AND POLYETHER SKELETONS, PHOTOSENSITIVE RESIN COMPOSITION, PATTERN FORMING PROCESS, AND FABRICATION OF OPTO-SEMICONDUCTOR DEVICE

CROSS-REFERENCE TO RELATED APPLICATION

This non-provisional application claims priority under 35 U.S.C. § 119(a) on Patent Application Nos. 2018-221908 and 2019-084933 filed in Japan on Nov. 28, 2018 and Apr. 26, 2019, respectively, the entire contents of which are hereby incorporated by reference.

TECHNICAL FIELD

This invention relates to a polysiloxane polymer containing isocyanuric acid and polyether skeletons, a photosensitive resin composition, a pattern forming process, and a method for fabricating an opto-semiconductor device.

BACKGROUND ART

Heretofore, epoxy resins are mainly used as the encapsulating/protecting material for optical devices, typically light-emitting diodes (LEDs) and CMOS image sensors. Among others, epoxy-modified silicone resins are mostly used because of high transparency and light resistance. For example, a silicone resin having an alicyclic epoxy group introduced in the silphenylene structure is known from Patent Document 1.

The conventional encapsulating/protecting materials clear the level of light resistance needed for prior art devices, but fail to clear the level of light resistance needed for advanced optical devices such as LEDs which are currently designed to produce higher outputs. They also suffer from outgassing and discoloration. Nowadays, many types of optical devices are produced by the micro-processing technology. For the micro-processing purpose, various resist materials as typified by epoxy resin-based materials are used. However, these materials are not amenable to micro-processing to a size of the order of 10 μm. As the epoxy resin material useful as resist material, Patent Document 2 discloses a composition comprising an epoxy resin and a dual end alicyclic epoxy-modified silphenylene crosslinker. For the goal of higher transparency, this composition is still insufficient in heat resistance and light resistance. There is a need for a composition for forming a film capable of withstanding severer conditions.

CITATION LIST

Patent Document 1: JP-B H08-32763 (U.S. Pat. No. 4,990,546)
Patent Document 2: JP-A 2012-001668 (U.S. Pat. No. 8,715,905, EP 2397508)

DISCLOSURE OF INVENTION

An object of the invention is to provide a novel polymer capable of forming a film having high transparency and light resistance; a photosensitive resin composition which enables pattern formation using radiation of widely varying wavelength, and forms a patterned film having high transparency, light resistance, and heat resistance; a pattern forming process using the resin composition; and a method for fabricating an opto-semiconductor device.

The inventors have found that a polymer comprising polysiloxane, silphenylene, isocyanuric acid, and polyether skeletons in a backbone and having an epoxy group in a side chain gives a film having high transparency and light resistance, that a photosensitive resin composition comprising the polymer and a photoacid generator is effective to form a film, from which a fine size pattern can be formed using radiation of widely varying wavelength, and that the patterned film exhibits high transparency, light resistance and heat resistance.

In one aspect, the invention provides a siloxane polymer comprising a polysiloxane skeleton, silphenylene skeleton, isocyanuric acid skeleton, and polyether skeleton in a backbone and having an epoxy group in a side chain.

Preferably, a film of the polymer having a thickness of 10 μm has a transmittance of at least 97% with respect to light of wavelength 405 nm.

In a preferred embodiment, the polymer comprises repeating units having the following formulae (A1) to (A4).

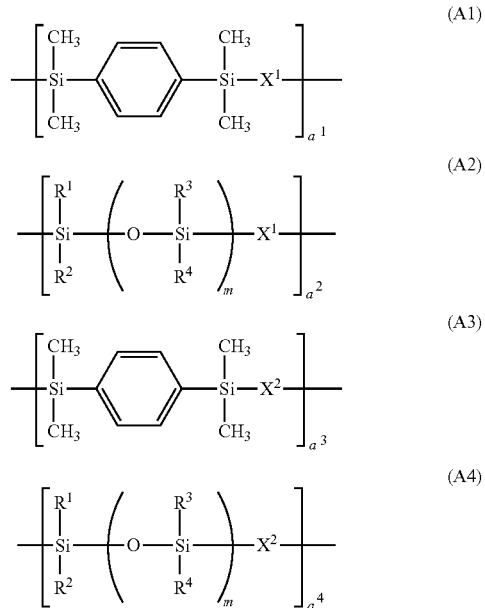

Herein $R^1$ to $R^4$ are each independently a $C_1$-$C_{20}$ monovalent hydrocarbon group which may contain a heteroatom, m is each independently an integer of 1 to 600, with the proviso that when m is an integer of at least 2, groups $R^3$ may be identical or different and groups $R^4$ may be identical or different, $a^1$, $a^2$, $a^3$, and $a^4$ are numbers in the range: $0<a^1<1$, $0<a^2<1$, $0<a^3<1$, $0<a^4<1$, and $a^1+a^2+a^3+a^4=1$. $X^1$ is a divalent group having the formula (X1):

(XI)

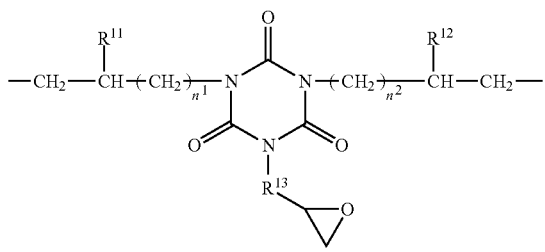

wherein $R^{11}$ and $R^{12}$ are each independently hydrogen or methyl, $n^1$ and $n^2$ are each independently an integer of 0 to 7, $R^{13}$ is a $C_1$-$C_8$ divalent hydrocarbon group in which an ester bond or ether bond may intervene between carbon atoms. $X^2$ is a divalent group having the formula (X2):

(X2)

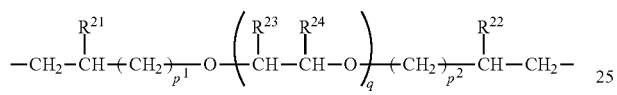

wherein $R^{21}$ and $R^{22}$ are each independently hydrogen or a $C_1$-$C_8$ monovalent hydrocarbon group, $R^{23}$ and $R^{24}$ are each independently hydrogen or methyl, $p^1$ and $p^2$ are each independently an integer of 1 to 6, and q is an integer of 0 to 100.

In preferred embodiments, q is an integer of 5 to 20; m is an integer of 10 to 100; $R^{11}$, $R^{12}$, $R^{21}$ and $R^{22}$ are hydrogen.

In a preferred embodiment, the polymer has a Mw of 3,000 to 500,000.

In another aspect, the invention provides a photosensitive resin composition comprising (A) the siloxane polymer defined above and (B) a photoacid generator, specifically 100 parts by weight of component (A) and 0.05 to 20 parts by weight of component (B).

The photosensitive resin composition may further comprise (C) a cationic polymerizable crosslinker, (D) a solvent, and/or (E) an antioxidant.

In a further aspect, the invention provides a pattern forming process comprising the steps of:
(i) applying the photosensitive resin composition defined above onto a substrate to form a photosensitive resin film thereon,
(ii) exposing the photosensitive resin film to radiation, and
(iii) developing the exposed resin film in a developer.

In a still further aspect, the invention provides a method for fabricating an opto-semiconductor device involving the pattern forming process defined above, the device comprising the patterned photosensitive resin film.

ADVANTAGEOUS EFFECTS OF INVENTION

The inventive siloxane polymer is easy to synthesize and gives a film having high transparency and light resistance. The photosensitive resin composition comprising the polymer and a photoacid generator is effectively coated to form a film without undergoing oxygen inhibition. A fine size pattern can be formed from the film by exposing it to radiation of widely varying wavelength. The film of the photosensitive resin composition exhibits excellent transparency, light resistance and heat resistance and is thus effective in the protecting and encapsulating applications associated with optical devices and the like.

DESCRIPTION OF PREFERRED EMBODIMENTS

The notation (Cn-Cm) means a group containing from n to m carbon atoms per group. "Optional" or "optionally" means that the subsequently described event or circumstances may or may not occur, and that description includes instances where the event or circumstance occurs and instances where it does not. PAG stands for photoacid generator.

Siloxane Polymer

One embodiment of the invention is a siloxane polymer comprising a polysiloxane skeleton, silphenylene skeleton, isocyanuric acid skeleton, and polyether skeleton in a backbone and having an epoxy group in a side chain.

The preferred polymer is defined as comprising repeating units having the following formulae (A1) to (A4), which are simply referred to as repeating units (A1) to (A4).

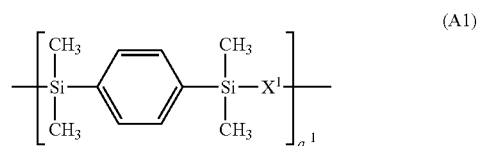
(A1)

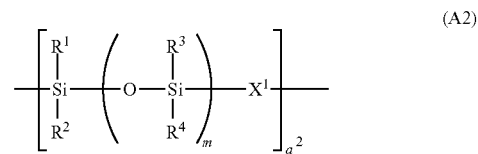
(A2)

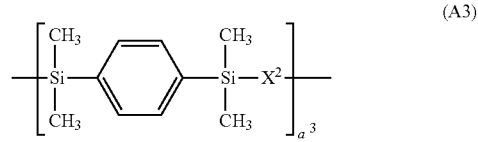
(A3)

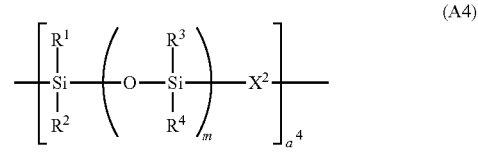
(A4)

In formulae (A2) and (A4), $R^1$ to $R^4$ are each independently a $C_1$-$C_{20}$ monovalent hydrocarbon group which may contain a heteroatom, m is each independently an integer of 1 to 600. When m is an integer of at least 2, groups $R^3$ may be identical or different and groups $R^4$ may be identical or different. In the repeating units (A2) and (A4), where at least two siloxane units are included, the siloxane units may be all identical, or at least two different siloxane units may be included. Where at least two different siloxane units are included (i.e., m is an integer of at least 2), the siloxane units may be bonded randomly or alternately, or a plurality of blocks each consisting of identical siloxane units may be included.

The monovalent hydrocarbon groups may be straight, branched or cyclic and include monovalent aliphatic hydrocarbon groups such as $C_1$-$C_{20}$ alkyl groups and $C_2$-$C_{20}$ alkenyl groups, and monovalent aromatic hydrocarbon groups such as $C_6$-$C_{20}$ aryl groups and $C_7$-$C_{20}$ aralkyl groups.

Suitable alkyl groups include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, n-octyl, n-nonyl, n-decyl, norbornyl and adamantyl. Suitable alkenyl groups include vinyl, propenyl, butenyl and pentenyl.

The monovalent aliphatic hydrocarbon group may contain a heteroatom. Specifically, in the monovalent aliphatic hydrocarbon group, some or all of the hydrogen atoms may be substituted by halogen atoms such as fluorine, chlorine, bromine and iodine, or a carbonyl moiety, ether bond or thioether bond may intervene between carbon atoms. Typical of the heteroatom-containing aliphatic hydrocarbon group is 2-oxocyclohexyl.

Suitable aryl groups include phenyl, 2-methylphenyl, 3-methylphenyl, 4-methylphenyl, 2-ethylphenyl, 3-ethylphenyl, 4-ethylphenyl, 4-tert-butylphenyl, 4-butylphenyl, dimethylphenyl, naphthyl, biphenylyl, and terphenylyl. Suitable aralkyl groups include benzyl and phenethyl.

The monovalent aromatic hydrocarbon group may contain a heteroatom. Specifically, in the monovalent aromatic hydrocarbon group, some or all hydrogen atoms may be substituted by $C_1$-$C_{10}$ alkoxy, $C_1$-$C_{10}$ alkylthio, $C_6$-$C_{20}$ aryloxy or $C_6$-$C_{20}$ arylthio groups.

Suitable $C_1$-$C_{10}$ alkoxy groups include methoxy, ethoxy, n-propyloxy, isopropyloxy, cyclopropyloxy, n-butyloxy, isobutyloxy, sec-butyloxy, tert-butyloxy, cyclobutyloxy, n-pentyloxy, cyclopentyloxy, n-hexyloxy, cyclohexyloxy, n-heptyloxy, n-octyloxy, n-nonyloxy, n-decyloxy, norbornyloxy, and adamantyloxy.

Suitable $C_1$-$C_{10}$ alkylthio groups include methylthio, ethylthio, n-propylthio, isopropylthio, cyclopropylthio, n-butylthio, isobutylthio, sec-butylthio, tert-butylthio, cyclobutylthio, n-pentylthio, cyclopentylthio, n-hexylthio, cyclohexylthio, n-heptylthio, n-octylthio, n-nonylthio, n-decylthio, norbornylthio, and adamantylthio.

Suitable $C_6$-$C_{20}$ aryloxy groups include phenyloxy, 2-methylphenyloxy, 3-methylphenyloxy, 4-methylphenyloxy, 2-ethylphenyloxy, 3-ethylphenyloxy, 4-ethylphenyloxy, 4-tert-butylphenyloxy, 4-butylphenyloxy, dimethylphenyloxy, naphthyloxy, biphenylyloxy, and terphenylyloxy.

Suitable $C_6$-$C_{20}$ arylthio groups include phenylthio, 2-methylphenylthio, 3-methylphenylthio, 4-methylphenylthio, 2-ethylphenylthio, 3-ethylphenylthio, 4-ethylphenylthio, 4-tert-butylphenylthio, 4-butylphenylthio, dimethylphenylthio, naphthylthio, biphenylylthio, and terphenylylthio.

Suitable substituted aryl groups include 2-methoxyphenyl, 3-methoxyphenyl, 4-methoxyphenyl, 2-ethoxyphenyl, 3-ethoxyphenyl, 4-ethoxyphenyl, 3-tert-butoxyphenyl, 4-tert-butoxyphenyl, biphenylyloxyphenyl, and biphenylylthiophenyl.

The monovalent aliphatic hydrocarbon groups preferably have 1 to 10 carbon atoms, more preferably 1 to 8 carbon atoms. The monovalent aromatic hydrocarbon groups preferably have 6 to 14 carbon atoms, more preferably 6 to 10 carbon atoms.

Of the foregoing groups, $R^1$ to $R^4$ are preferably selected from methyl, ethyl, n-propyl and phenyl, more preferably methyl and phenyl.

In formulae (A2) and (A4), m is each independently an integer of 1 to 600, preferably 8 to 100.

In formulae (A1) to (A4), $a^1$, $a^2$, $a^3$, and $a^4$ are numbers in the range: $0<a^1<1$, $0<a^2<1$, $0<a^3<1$, $0<a^4<1$, and $a^1+a^2+a^3+a^4=1$;

preferably $0.010 \leq a^1+a^2 \leq 0.490$, $0.010 \leq a^3+a^4 \leq 0.490$, $0.050 \leq a^1+a^3 \leq 0.490$, $0.010 \leq a^2+a^4 \leq 0.450$, and $a^1+a^2+a^3+a^4=1$;

more preferably $0.050 \leq a^1+a^2 \leq 0.450$, $0.050 \leq a^3+a^4 \leq 0.450$, $0.200 \leq a^1+a^3 \leq 0.450$, $0.050 \leq a^2+a^4 \leq 0.300$, and $a^1+a^2+a^3+a^4=1$.

In formulae (A1) and (A2), $X^1$ is a divalent group having the formula (X1).

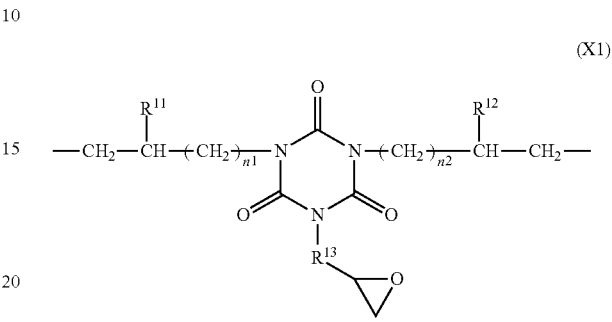

(X1)

In formula (X1), $R^{11}$ and $R^{12}$ are each independently hydrogen or methyl, $n^1$ and $n^2$ are each independently an integer of 0 to 7.

In formula (X1), $R^{13}$ is a $C_1$-$C_8$ divalent hydrocarbon group in which an ester bond or ether bond may intervene between carbon atoms. The divalent hydrocarbon group may be straight, branched or cyclic and examples thereof include alkanediyl groups such as methylene, ethane-1,1-diyl, ethane-1,2-diyl, propane-1,2-diyl, propane-1,3-diyl, butane-1,2-diyl, butane-1,3-diyl, and butane-1,4-diyl. In the divalent hydrocarbon group, an ester bond or ether bond may intervene between carbon atoms. Inter alia, $R^{13}$ is preferably methylene or ethylene, with methylene being more preferred.

In formulae (A3) and (A4), $X^2$ is a divalent group having the formula (X2).

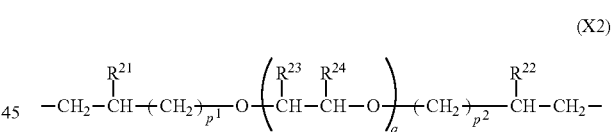

(X2)

In formula (X2), $R^{21}$ and $R^{22}$ are each independently hydrogen or a $C_1$-$C_8$ monovalent hydrocarbon group. $R^{23}$ and $R^{24}$ are each independently hydrogen or methyl. The subscripts $p^1$ and $p^2$ are each independently an integer of 1 to 6, preferably an integer of 1 to 4, more preferably 1 or 2; and q is an integer of 0 to 100, preferably an integer of 1 to 50, more preferably an integer of 5 to 20.

The $C_1$-$C_8$ monovalent hydrocarbon group may be straight, branched or cyclic and examples thereof include monovalent aliphatic hydrocarbon groups such as $C_1$-$C_8$ alkyl groups and $C_2$-$C_8$ alkenyl groups, and monovalent aromatic hydrocarbon groups such as $C_6$-$C_8$ aryl groups and $C_7$-$C_8$ aralkyl groups.

Suitable alkyl groups include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, and n-octyl. Suitable alkenyl groups include vinyl, propenyl, butenyl and pentenyl.

Suitable aryl groups include phenyl, 2-methylphenyl, 3-methylphenyl, 4-methylphenyl, 2-ethylphenyl, 3-ethylphenyl, 4-ethylphenyl, and dimethylphenyl. Suitable aralkyl groups include benzyl and phenethyl.

$R^{21}$ and $R^{22}$ are preferably hydrogen or a $C_1$-$C_8$ alkyl group, more preferably hydrogen or methyl.

In formula (X2), the alkylene oxide units with subscript q may be bonded randomly or alternately, and a plurality of blocks each consisting of identical alkylene oxide units may be included.

The siloxane polymer preferably has a weight average molecular weight (Mw) of 3,000 to 500,000, more preferably 5,000 to 200,000. A polymer having a Mw in the range is solid and has a film forming ability. Throughout the disclosure, Mw is measured versus polystyrene standards by gel permeation chromatography (GPC) using tetrahydrofuran (THF) as eluent.

In the siloxane polymer, the repeating units (A1) to (A4) may be bonded randomly to or alternately, and a plurality of blocks each consisting of identical units may be included. The siloxane polymer preferably has a siloxane unit content of 10 to 90% by weight.

Preparation of Polysiloxane Skeleton Polymer

The polymer may be prepared by combining a compound having the formula (1), a compound having the formula (2), a compound having the formula (3), and a compound having the formula (4), and conducting addition polymerization in the presence of a metal catalyst. Notably these compounds are simply referred to as compounds (1), (2), (3), and (4).

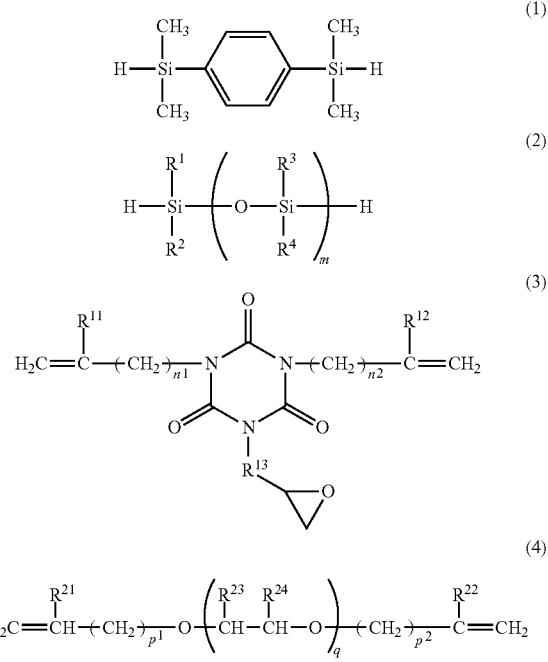

Herein $R^1$ to $R^4$, $R^{11}$ to $R^{13}$, $R^{21}$ to $R^{24}$, m, $n^1$, $n^2$, $p^1$, $p^2$, and q are as defined above.

Examples of the metal catalyst used herein include platinum group metals alone such as platinum (including platinum black), rhodium and palladium; platinum chlorides, chloroplatinic acids and chloroplatinates such as $H_2PtCl_4.xH_2O$, $H_2PtCl_6.xH_2O$, $NaHPtCl_6.xH_2O$, $KHPtCl_6.xH_2O$, $Na_2PtCl_6.xH_2O$, $K_2PtCl_4.xH_2O$, $PtCl_4.xH_2O$, $PtCl_2$ and $Na_2HPtCl_4.xH_2O$, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. Nos. 3,159,601, 3,159,662 and 3,775,452; supported catalysts comprising platinum group metals such as platinum black and palladium on supports of alumina, silica and carbon; rhodium-olefin complexes; chlorotris(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight of platinum group metal based on the total weight of compounds (1) to (4).

In the polymerization reaction, a solvent may be used, if desired. Suitable solvents are hydrocarbon solvents such as toluene and xylene. The reaction temperature is preferably in a range of 40 to 150° C., more preferably 60 to 120° C., within which the catalyst is not deactivated and the polymerization can be completed within a short time. The polymerization time varies with the type and amount of the starting compounds. It is preferably about 0.5 to about 100 hours, more preferably about 0.5 to about 30 hours for preventing moisture entry into the polymerization system. After the completion of reaction, the solvent (if used) is distilled off, whereupon the polymer is obtained.

The reaction procedure is not particularly limited. The preferred procedure is by first mixing compounds (3) and (4), heating, adding a metal catalyst to the mixture, and then adding compounds (1) and (2) dropwise over 0.1 to 5 hours.

In the polymerization reaction, the starting compounds are preferably combined in such amounts that a molar ratio of the total amount of hydrosilyl groups in compounds (1) and (2) to the total amount of alkenyl groups in compounds (3) and (4) may range from 0.67 to 1.67, more preferably from 0.83 to 1.25.

The Mw of the siloxane polymer can be controlled using a molecular weight control agent such as a monoallyl compound (e.g., o-allylphenol), monohydrosilane (e.g., triethylhydrosilane) or monohydrosiloxane.

Photosensitive Resin Composition

Another embodiment of the invention is a photosensitive resin composition comprising (A) the siloxane polymer defined above and (B) a photoacid generator. The siloxane polymer (A) may be used alone or in admixture.

(B) Photoacid Generator

The photoacid generator as component (B) is not particularly limited as long as it is decomposed to generate an acid upon light exposure, preferably it is decomposed to generate an acid upon exposure to light of wavelength 190 to 500 nm. The PAG (B) serves as a curing catalyst. Suitable PAGs include onium salts, diazomethane derivatives, glyoxime derivatives, β-ketosulfone derivatives, disulfone derivatives, nitrobenzyl sulfonate derivatives, sulfonic acid ester derivatives, imidoyl sulfonate derivatives, oxime sulfonate derivatives, iminosulfonate derivatives, and triazine derivatives.

Exemplary onium salts include sulfonium salts having the formula (B1) and iodonium salts having the formula (B2).

In formulae (B1) and (B2), $R^{101}$ to $R^{105}$ are each independently an optionally substituted $C_1$-$C_{12}$ alkyl group, an optionally substituted $C_6$-$C_{12}$ aryl group, or an optionally substituted $C_7$-$C_{12}$ aralkyl group. $A^-$ is a non-nucleophilic counter ion.

The alkyl groups may be straight, branched or cyclic and include, for example, methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl and adamantyl. The aryl groups include phenyl, naphthyl and biphenylyl. The aralkyl groups include benzyl and phenethyl. Suitable substituents on these groups include oxo, straight, branched or cyclic $C_1$-$C_{12}$ alkoxy, straight, branched or cyclic $C_1$-$C_{12}$ alkyl, $C_6$-$C_{24}$ aryl, $C_7$-$C_{25}$ aralkyl, $C_6$-$C_{24}$ aryloxy, and $C_6$-$C_{24}$ arylthio groups.

Preferred examples of $R^{101}$ to $R^{105}$ include optionally substituted alkyl groups such as methyl, ethyl, propyl, butyl, cyclohexyl, norbornyl, adamantyl and 2-oxocyclohexyl; optionally substituted aryl groups such as phenyl, naphthyl, biphenylyl, o-, m- or p-methoxyphenyl, ethoxyphenyl, m- or p-tert-butoxyphenyl, 2-, 3- or 4-methylphenyl, ethylphenyl, 4-tert-butylphenyl, 4-butylphenyl, dimethylphenyl, terphenylyl, biphenylyl, oxyphenyl, and biphenylylthiophenyl; and optionally substituted aralkyl groups such as benzyl and phenethyl. Of these, optionally substituted aryl groups and optionally substituted aralkyl groups are more preferred.

Examples of the non-nucleophilic counter ion include halide ions such as chloride and bromide; fluoroalkkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; fluoroalkanesulfonimide ions such as trifluoromethanesulfonimide; fluoroalkanesulfonylmethide ions such as tris(trifluoromethanesulfonyl)methide; and borate ions such as tetrakisphenylborate and tetrakis(pentafluorophenyl)borate.

Exemplary diazomethane derivatives include compounds having the formula (B3).

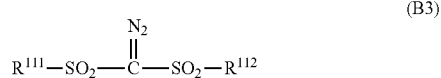

(B3)

In formula (B3), $R^{111}$ and $R^{112}$ are each independently a $C_1$-$C_{12}$ alkyl or haloalkyl group, an optionally substituted $C_6$-$C_{12}$ aryl group, or a $C_7$-$C_{12}$ aralkyl group.

The alkyl group may be straight, branched or cyclic and examples thereof are as exemplified above for $R^{101}$ to $R^{105}$. Examples of the haloalkyl group include trifluoromethyl, 1,1,1-trifluoroethyl, 1,1,1-trichloroethyl, and nonafluorobutyl.

Examples of the optionally substituted aryl group include phenyl; alkoxyphenyl groups such as 2-, 3- or 4-methoxyphenyl, 2-, 3- or 4-ethoxyphenyl, 3- or 4-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Examples of the aralkyl group include benzyl and phenethyl.

Exemplary glyoxime derivatives include compounds having the formula (B4).

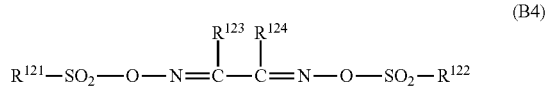

(B4)

In formula (B4), $R^{121}$ to $R^{124}$ are each independently a $C_1$-$C_{12}$ alkyl or haloalkyl group, an optionally substituted $C_6$-$C_{12}$ aryl group, or a $C_7$-$C_{12}$ aralkyl group. $R^{123}$ and $R^{124}$ may bond together to form a ring with the carbon atoms to which they are attached. In the case of ring formation, $R^{123}$ bonds with $R^{124}$ to form a $C_1$-$C_{12}$ straight or branched alkylene group.

Examples of the alkyl, haloalkyl, optionally substituted aryl and aralkyl groups are as exemplified above for $R^{111}$ and $R^{112}$. Examples of the straight or branched alkylene group include methylene, ethylene, propylene, butylene, and hexylene.

Examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl(4-thiophenoxyphenyl)sulfonium hexafluoroantimonate, [4-(4-biphenylylthio)phenyl]-4-biphenylylphenylsulfonium tris(trifluoromethane-sulfonyl)methide, triphenylsulfonium tetrakis(fluorophenyl)borate, tris[4-(4-acetylphenyOthiophenyl]sulfonium tetrakis(fluorophenyl)borate, triphenylsulfonium tetrakis(pentafluorophenyl)borate, and tris[4-(4-acetylphenyOthiophenyl]sulfonium tetrakis(pentafluorophenyl)borate.

Examples of the diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-pentylsulfonyl)diazomethane, bis(isopentylsulfonyl)diazomethane, bis(sec-pentylsulfonyl)diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n- butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Examples of the β-ketosulfone derivatives include 2-cyclohexylcarbonyl-2-(p-toluenesulfonyl)propane and 2-isopropylcarbonyl-2-(p-toluenesulfonyl)propane.

Examples of the disulfone derivatives include diphenyl disulfone and dicyclohexyl disulfone.

Examples of the nitrobenzyl sulfonate derivatives include 2,6-dinitrobenzyl p-toluenesulfonate and 2,4-dinitrobenzyl p-toluenesulfonate.

Examples of the sulfonic acid ester derivatives include 1,2,3-tris(methanesulfonyloxy)benzene, 1,2,3-tris(trifluoromethanesulfonyloxy)benzene, and 1,2,3-tris(p-toluenesulfonyloxy)benzene.

Examples of the imido-yl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and n-trifluoromethylsulfonyloxynaphthylimide.

Typical of the oxime sulfonate derivative is α-(benzenesulfoniumoxyimino)-4-methylphenylacetonitrile.

Examples of the iminosulfonate derivatives include (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile. Also 2-methyl-2-[(4-methylphenyl)sulfonyl]-1-[(4-methylthio)phenyl]-1-propane is useful.

As the PAG, the onium salts are preferred, with the sulfonium salts being more preferred.

Preferably the PAG (B) is used in an amount of 0.05 to 20 parts by weight, more preferably 0.1 to 5 parts by weight per 100 parts by weight of component (A). An amount of PAG in the range ensures sufficient photo-curability and is effective for preventing the cure behavior of a thick film from being degraded by the photo-absorption of the PAG itself. To acquire transparency and light resistance characteristic of the invention, the amount of photo-absorptive PAG (B) is as small as possible within the range that insures photo-curability. The PAG may be used alone or in admixture.

(C) Cationic Polymerizable Crosslinker

The photosensitive resin composition may further comprise (C) a cationic polymerizable crosslinker. The cationic polymerizable crosslinker undergoes cationic polymerization reaction with epoxy groups on component (A) to facilitate pattern formation and serves to increase the strength of a resin film as photo-cured.

The crosslinker is preferably selected from compounds having a molecular weight of 100 to 15,000, more preferably 200 to 1,000. A compound having a molecular weight of at least 100 provides sufficient photo-cure whereas a compound having a molecular weight of up to 15,000 does not exacerbate the heat resistance of a composition as photo-cured. Notably the compound may be a resin or polymer, and in this case, the molecular weight is a weight average molecular weight (Mw).

As the cationic polymerizable crosslinker, compounds having a functional group selected from epoxy, oxetane and vinyl ether groups are preferred. Such compounds may be used alone or in admixture.

An amount of component (C) is 0 to 100 parts by weight per 100 parts by weight of component (A), and when used, preferably 0.5 to 100 parts, more preferably 0.5 to 60 parts by weight. When the amount of component (C) is at least 0.5 part, sufficient cure upon light exposure is obtainable. When the amount of component (C) is up to 100 parts, the proportion of component (A) in the composition is not so reduced, allowing a cured composition to exert the desired effect. Component (C) may be used alone or in admixture.

(D) Solvent

To the photosensitive resin composition, (D) a solvent may be added in order to facilitate the coating operation. The solvent (D) used herein is not particularly limited as long as components (A) to (C) and other additives (to be described later) are soluble therein.

Preferred solvents are organic solvents. Illustrative, non-limiting, examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used alone or in combinations of two or more.

Of these solvents, preferred are ethyl lactate, cyclohexanone, cyclopentanone, PGMEA, γ-butyrolactone, and mixtures thereof, in which the PAG is most soluble.

It is preferred from the standpoints of compatibility and viscosity of the resin composition that the solvent (D) be used in an amount of 50 to 2,000 parts, more preferably 50 to 1,000 parts, and especially 50 to 100 parts by weight per 100 parts by weight of component (A).

(E) Antioxidant

The photosensitive resin composition may further contain (E) an antioxidant as an additive which is effective for improving heat resistance. The antioxidant is preferably selected from hindered phenol compounds and hindered amine compounds.

Although the hindered phenol compounds used herein are not particularly limited, the hindered phenol compounds listed below are preferred. 1,3,5-trimethyl-2,4,6-tris(3,5-di-t-butyl-4-hydroxybenzyl)benzene (trade name: IRGANOX 1330), 2,6-di-t-butyl-4-methylphenol (trade name: Sumilizer BHT), 2,5-di-t-butylhydroquinone (trade name: Nocrac NS-7), 2,6-di-t-butyl-4-ethylphenol (trade name: Nocrac M-17), 2,5-di-t-pentylhydroquinone (trade name: Nocrac DAH), 2,2'-methylenebis(4-methyl-6-t-butylphenol) (trade name: Nocrac NS-6), 3,5-di-t-butyl-4-hydroxybenzyl phosphonate diethyl ester (trade name: IRGANOX 1222), 4,4'-thiobis(3-methyl-6-t-butylphenol) (trade name: Nocrac 300), 2,2'-methylenebis(4-ethyl-6-t-butylphenol) (trade name: Nocrac NS-5), 4,4'-butylidenebis(3-methyl-6-t-butylphenol) (trade name: Adeka Stab AO-40), 2-t-butyl-6-

(3-t-butyl-2-hydroxy-5-methylbenzyl)-4-methylphenyl acrylate (trade name: Sumilizer GM), 2-[1-(2-hydroxy-3,5-di-t-pentylphenyl)ethyl]-4,6-di-t-pentylphenyl acrylate (trade name: Sumilizer GS), 2,2'-methylenebis[4-methyl-6-(α-methylcyclohexyl)phenol], 4,4'-methylenebis(2,6-di-t-butylphenol) (trade name: Seenox 226M), 4,6-bis(octylthiomethyl)-o-cresol (trade name: IRGANOX 1520L), 2,2'-ethylenebis(4,6-di-t-butylphenol), octadecyl 3-(3,5-di-t-butyl-4-hydroxyphenyl)propionate (trade name: IRGANOX 1076), 1,1,3-tris(2-methyl-4-hydroxy-5-t-butylphenyl)butane (trade name: Adeka Stab AO-30), tetrakis[methylene-(3,5-di-t-butyl-4-hydroxyhydrocinnamate)]methane (trade name: Adeka Stab AO-60), triethylene glycol bis[3-(3-t-butyl-5-methyl-4-hydroxyphenyl)propionate] (trade name: IRGANOX 245), 2,4-bis(n-octylthio)-6-(4-hydroxy-3,5-di-t-butylanilino)-1,3,5-triazine (trade name: IRGANOX 565), N,N'-hexamethylenebis(3,5-di-t-butyl-4-hydroxyhydrocinnamide) (trade name: IRGANOX 1098), 1,6-hexanediol-bis[3-(3,5-di-t-butyl-4-hydroxyphenyl)propionate] (trade name: IRGANOX 259), 2,2-thio-diethylenebis[3-(3,5-di-t-butyl-4-hydroxyphenyl)-propionate] (trade name: IRGANOX 1035), 3,9-bis[2-[3-(3-t-butyl-4-hydroxy-5-methylphenyl)propionyloxy]-1,1-dimethylethyl] 2,4,8,10-tetraoxaspiro[5.5]undecane (trade name: Sumilizer GA-80), tris(3,5-di-t-butyl-4-hydroxybenzyl) isocyanurate (trade name: IRGANOX 3114), bis(ethyl 3,5-di-t-butyl-4-hydroxybenzylphosphonate) calcium/polyethylene wax 50/50 mixture (trade name: IRGANOX 1425WL), isooctyl 3-(3, 5-di-t-butyl-4-hydroxyphenyl)propionate (trade name: IRGANOX 1135), 4,4'-thiobis(6-t-butyl-3-methylphenol) (trade name: Sumilizer WX-R), 6-[3-(3-t-butyl-4-hydroxy-5-methylphenyl)propoxy]-2,4,8,10-tetra-t-butyldibenzo[d,f][1,3,2]dioxaphosphepin (trade name: Sumilizer GP), etc.

Although the hindered amine compounds used herein are not particularly limited, the hindered amine compounds listed below are preferred.

p,p'-dioctyldiphenylamine (trade name: IRGANOX 5057), phenyl-α-naphthylamine (trade name: Nocrac PA), poly(2,2,4-trimethyl-1,2-dihydroquinoline) (trade name: Nocrac 224, 224-S), 6-ethoxy-2,2,4-trimethyl-1,2-dihydroquinoline (trade name: Nocrac AW), N,N'-diphenyl-p-phenylenediamine (trade name: Nocrac DP), N,N'-di-β-naphthyl-p-phenylenediamine (trade name: Nocrac White), N-phenyl-N'-isopropyl-p-phenylenediamine (trade name: Nocrac 810NA), N,N'-diallyl-p-phenylenediamine (trade name: Nonflex TP), 4,4'-(α,α-dimethylbenzyl)diphenylamine (trade name: Nocrac CD), p,p-toluenesulfonylaminodiphenylamine (trade name: Nocrac TD), N-phenyl-N'-(3-methacryloxy-2-hydroxypropyl)-p-phenylenediamine (trade name: Nocrac G1), N-(1-methylheptyl)-N'-phenyl-p-phenylenediamine (trade name: Ozonon 35), N,N'-di-sec-butyl-p-phenylenediamine (trade name: Sumilizer BPA), N-phenyl-N'-1,3-dimethylbutyl-p-phenylenediamine (trade name: Antigene 6C), alkylated diphenylamine (trade name: Sumilizer 9A), dimethyl-1-(2-hydroxyethyl)-4-hydroxy-2,2,6,6-tetramethylpiperidine succinate polycondensate (trade name: Tinuvin 622LD), poly[[6-(1,1,3,3-tetramethylbutyl)amino]-1,3,5-triazine-2,4-diyl][(2,2,6,6-tetramethyl-4-piperidyl)imino]hexamethylene[(2,2,6,6-tetramethyl-4-piperidyl)imino]] (trade name: CHIMASSORB 944), N,N'-bis(3-aminopropyl)ethylenediamine-2,4-bis[N-butyl-N-(1,2,2,6,6-pentamethyl-4-piperidyl)amino]-6-chloro-1,3,5-triazine condensate (trade name: CHIMASSORB 119FL), bis(1-octyloxy-2,2,6,6-tetramethyl-4-piperidyl)sebacate (trade name: Tinuvin 123), bis(2,2,6,6-tetramethyl-4-piperidyl)sebacate (trade name: Tinuvin 770), bis(1,2,2,6,6-pentamethyl-4-piperidyl) 2-(3,5-di-t-butyl-4-hydroxybenzyl)-2-n-butylmalonate (trade name: Tinuvin 144), bis(1,2,2,6,6-pentamethyl-4-piperidyl)sebacate (trade name: Tinuvin 765), tetrakis(1,2,2,6,6-pentamethyl-4-piperidyl) 1,2,3,4-butanetetracarboxylate (trade name: LA-57), tetrakis(2,2,6,6-tetramethyl-4-piperidyl) 1,2,3,4-butanetetracarboxylate (trade name: LA-52), an esterified mixture of 1,2,3,4-butanetetracarboxylic acid with 1,2,2,6,6-pentamethyl-4-piperidinol and 1-tridecanol (trade name: LA-62), an esterified mixture of 1,2,3,4-butanetetracarboxylic acid with 2,2,6,6-tetramethyl-4-piperidinol and 1-tridecanol (trade name: LA-67), an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P), an esterified mixture of 1,2,3,4-butanetetracarboxylic acid with 2,2,6,6-tetramethyl-4-piperidinol and 3,9-bis(2-hydroxy-1,1-dimethylethyl)-2,4,8,10-tetraoxaspiro[5.5]undecane (trade name: LA-68LD), (2,2,6,6-tetramethylene-4-piperidyl)-2-propylene carboxylate (trade name: Adeka Stab LA-82), (1,2,2,6,6-pentamethyl-4-piperidyl)-2-propylene carboxylate (trade name: Adeka Stab LA-87), etc.

The amount of component (E) used is not particularly limited as long as the benefits of the invention are not impaired. When used, the amount of component (E) is preferably 0.01 to 1% by weight of the resin composition. The antioxidants may be used alone or in admixture.

Other Additives

Besides the aforementioned components, the photosensitive resin composition may contain optional additives, for example, surfactants which are commonly used for improving coating properties and silane coupling agents.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093. The amount of surfactant is not particularly limited as long as the benefits of the invention are not impaired. When used, the amount of the surfactant is preferably 0.01 to 1% by weight of the resin composition.

Inclusion of a silane coupling agent is effective for enhancing the adhesion of the resin composition to adherends. Suitable silane coupling agents include epoxy silane coupling agents and aromatic aminosilane coupling agents. The silane coupling agent may be used alone or in admixture. The amount of the silane coupling agent used is not particularly limited as long as the benefits of the invention are not impaired. When used, the amount of the silane coupling agent is preferably 0.01 to 5% by weight of the resin composition.

The photosensitive resin composition of the invention is prepared in any desired way. For example, it may be prepared by agitating and mixing the aforementioned components and optionally passing the mixture through a filter to remove any solids.

Pattern Forming Process

Another embodiment of the invention is a pattern forming process using the photosensitive resin composition defined above, the process comprising the steps of:

(i) applying the photosensitive resin composition onto a substrate to form a photosensitive resin film thereon, (ii) exposing the photosensitive resin film to radiation, and (iii) developing the exposed resin film in a developer for thereby forming a fine size pattern.

In step (i), the photosensitive resin composition is applied onto a substrate to form a to photosensitive resin film thereon. Examples of the substrate include silicon wafers, glass wafers, quartz wafers, plastic circuit substrates, and ceramic circuit substrates.

The photosensitive resin film may be formed by any well-known techniques. For example, the photosensitive resin composition is coated onto a substrate by a coating technique such as dipping, spin coating or roll coating. The coating weight may be selected as appropriate for a particular purpose, preferably so as to form a resin film having a thickness of 0.1 to 100 μm.

At this point, the coating may be prebaked to evaporate off the solvent and the like, if necessary, for efficient photo-cure reaction. Prebake may be performed, for example, at 40 to 160° C. for 1 minute to about 1 hour.

Next, in step (ii), the photosensitive resin film is exposed to radiation. The exposure radiation is preferably of wavelength 240 to 500 nm. Examples of the radiation include radiation of various wavelengths from radiation-emitting units, specifically UV radiation such as g- or i-line and deep UV (248 nm). An appropriate exposure dose is 10 to 5,000 mJ/cm$^2$.

The exposure may be performed through a photomask. The photomask used herein may be, for example, one perforated with a desired pattern. Although the material of the photomask is not particularly limited, a material capable of shielding radiation of wavelength 240 to 500 nm is preferred, for example, chromium.

The next step may be post-exposure bake (PEB) which is effective for enhancing development sensitivity. PEB is performed, for example, at 40 to 160° C. for 5 to 30 minutes.

Step (iii) following the exposure or PEB is to develop the resin film in a developer. The preferred developers are organic solvents, for example, isopropyl alcohol (IPA), propylene glycol monomethyl ether (PGME), and propylene glycol monomethyl ether acetate (PGMEA). By development in organic solvent-based developers, the unexposed region of the resin film is dissolved away, yielding a negative pattern. Development is effected in a conventional manner, for example, by dipping the exposed film in the developer. The development is followed by washing, rinsing and drying if necessary. In this way, a resin film having the desired pattern is obtained.

Although the pattern forming process has been described, it is sometimes unnecessary to form a pattern. When it is simply desired to form a uniform film, for example, the same process as above may be followed except that in step (ii), the resin film is exposed to radiation of suitable wavelength directly, i.e., without the photomask.

In subsequent step (iv), the patterned film may be post-cured, if necessary, in an oven or hot plate at a temperature of preferably 120 to 300° C. for 10 minutes to 10 hours for increasing the crosslinking density of the resin film and removing any residual volatile matter.

Opto-Semiconductor Device

An opto-semiconductor device may be produced by using the photosensitive resin composition, and processing it to form a fine size pattern according to the aforementioned process. Since a film of the photosensitive resin composition has excellent transparency, light resistance and heat resistance, an opto-semiconductor device having the film is advantageously used as optical devices including light-emitting devices such as LED, light-receiving devices such as photodiodes, optical sensors, and CMOS image sensors, and optical transmission devices such as optical waveguides. Preferably the film has a transmittance of at least 92%, more preferably at least 96%, even more preferably at least 98%, with respect to light of wavelength 405 nm.

EXAMPLES

Examples of the invention are given below by way of illustration and not by way of limitation. Notably, the weight average molecular weight (Mw) is measured versus monodisperse polystyrene standards by GPC under conditions including column TSKgel Super HZM-H (Tosoh Corp.), flow rate 0.6 mL/min, eluent THF, and column temperature 40° C. For $^1$H-NMR spectroscopy, an analyzer of Bruker Corp. was used. All parts are by weight (pbw).

Compounds (S-1), (S-2a), (S-2b), (S-3a), (S-3b), (S-4), (S-5) and (S-6) used in the synthesis of polymers are identified below.

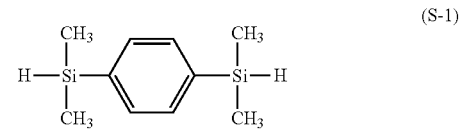
(S-1)

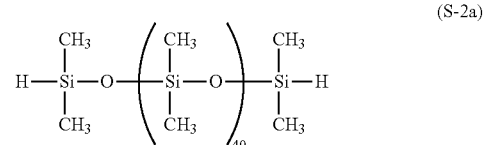
(S-2a)

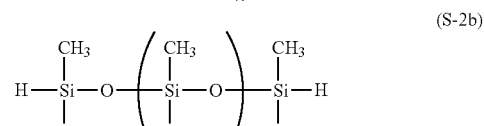
(S-2b)

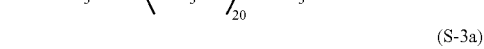
(S-3a)

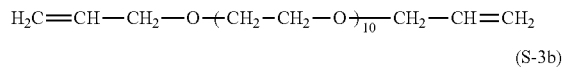
(S-3b)

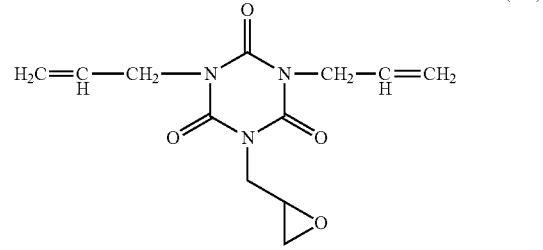
(S-4)

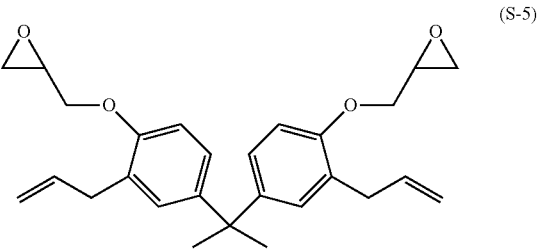
(S-5)

-continued

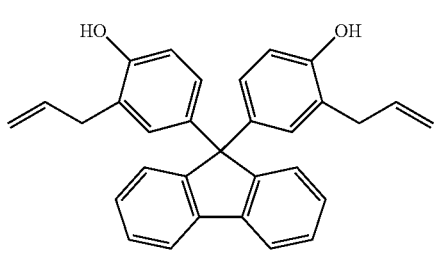

(S-6)

[1] Synthesis and Evaluation of Polymers (1) Synthesis of Polymers

Example 1-1

Synthesis of Polymer 1

A 10-L flask equipped with a stirrer, thermometer, nitrogen purge line, and reflux condenser was charged with 132.5 g (0.50 mol) of Compound (S-4) and 269.5 g (0.50 mol) of Compound (S-3a), then with 2,000 g of toluene, and heated at 70° C. Thereafter, 1.0 g of a chloroplatinic acid toluene solution (Pt concentration 0.5 wt %) was added, and 116.4 g (0.60 mol) of Compound (S-1) and 1208.0 g (0.40 mol) of Compound (S-2a) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Polymer 1. Polymer 1 had a Mw of 43,000 and a siloxane unit content of 70.0 wt %. On $^1$H-NMR analysis, Polymer 1 was found to consist of repeating units (A1) to (A4).

Example 1-2

Synthesis of Polymer 2

A 10-L flask equipped with a stirrer, thermometer, nitrogen purge line, and reflux condenser was charged with 79.5 g (0.30 mol) of Compound (S-4) and 377.3 g (0.70 mol) of Compound (S-3a), then with 2,000 g of toluene, and heated at 70° C. Thereafter, 1.0 g of a chloroplatinic acid toluene solution (Pt concentration 0.5 wt %) was added, and 174.6 g (0.90 mol) of Compound (S-1) and 158.5 g (0.10 mol) of Compound (S-2b) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Polymer 2. Polymer 2 had a Mw of 83,000 and a siloxane unit content of 20.1 wt %. On $^1$H-NMR analysis, Polymer 2 was found to consist of repeating units (A1) to (A4).

Example 1-3

Synthesis of Polymer 3

A 10-L flask equipped with a stirrer, thermometer, nitrogen purge line, and reflux condenser was charged with 26.5 g (0.10 mol) of Compound (S-4) and 485.1 g (0.90 mol) of Compound (S-3a), then with 2,000 g of toluene, and heated at 70° C. Thereafter, 1.0 g of a chloroplatinic acid toluene solution (Pt concentration 0.5 wt %) was added, and 135.8 g (0.70 mol) of Compound (S-1) and 475.5 g (0.30 mol) of Compound (S-2b) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Polymer 3. Polymer 3 had a Mw of 8,000 and a siloxane unit content of 42.3 wt %. On $^1$H-NMR analysis, Polymer 3 was found to consist of repeating units (A1) to (A4).

Example 1-4

Synthesis of Polymer 4

A 10-L flask equipped with a stirrer, thermometer, nitrogen purge line, and reflux condenser was charged with 238.5 g (0.90 mol) of Compound (S-4) and 53.9 g (0.10 mol) of Compound (S-3a), then with 2,000 g of toluene, and heated at 70° C. Thereafter, 1.0 g of a chloroplatinic acid toluene solution (Pt concentration 0.5 wt %) was added, and 155.2 g (0.80 mol) of Compound (S-1) and 604.0 g (0.20 mol) of Compound (S-2a) were added dropwise over 1 hour (total hydrosilyl groups/total carbon-carbon double bonds=1/1 in molar ratio). After the completion of dropwise addition, the solution was heated at 100° C. and aged for 6 hours. From the reaction solution, the toluene was distilled off in vacuum, yielding Polymer 4. Polymer 4 had a Mw of 143,000 and a siloxane unit content of 57.4 wt %. On $^1$H-NMR analysis, Polymer 4 was found to consist of repeating units (A1) to (A4).

Example 1-5

Synthesis of Polymer 5

A 10-L flask equipped with a stirrer, thermometer, nitrogen purge line, and reflux condenser was charged with 185.5 g (0.70 mol) of Compound (S-4) and 254.5 g (0.30 mol) of Compound (S-3b), then with 2,000 g of toluene, and heated at 70° C. Thereafter, 1.0 g of a chloroplatinic acid toluene solution (Pt concentration 0.5 wt %) was added, and 77.6 g (0.40 mol) of Compound (S-1) and 951.0 g (0.60 mol) of Compound (S-2b) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Polymer 5. Polymer 5 had a Mw of 23,000 and a siloxane unit content of 65.2 wt %. On $^1$H-NMR analysis, Polymer 5 was found to consist of repeating units (A1) to (A4).

Example 1-6

Synthesis of Polymer 6

A 10-L flask equipped with a stirrer, thermometer, nitrogen purge line, and reflux condenser was charged with 132.5 g (0.50 mol) of Compound (S-4) and 409.0 g (0.50 mol) of Compound (S-3b), then with 2,000 g of toluene, and heated at 70° C. Thereafter, 1.0 g of a chloroplatinic acid toluene solution (Pt concentration 0.5 wt %) was added, and 174.6 g (0.90 mol) of Compound (S-1) and 302.0 g (0.10 mol) of Compound (S-2a) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Polymer 6. Polymer 6 had a Mw of 103,000 and a siloxane unit content of 29.7 wt %. On $^1$H-NMR analysis, Polymer 6 was found to consist of repeating units (A1) to (A4).

Comparative Example 1-1

Synthesis of Comparative Polymer 1

A 10-L flask equipped with a stirrer, thermometer, nitrogen purge line, and reflux condenser was charged with 212.0 g (0.80 mol) of Compound (S-4) and 86.0 g (0.20 mol) of Compound (S-6), then with 2,000 g of toluene, and heated at 70° C. Thereafter, 1.0 g of a chloroplatinic acid toluene solution (Pt concentration 0.5 wt %) was added, and 184.3 g (0.95 mol) of Compound (S-1) and 79.3 g (0.05 mol) of Compound (S-2b) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Comparative Polymer 1. Comparative Polymer 1 had a Mw of 8,000 and a siloxane unit content of 14.1 wt %.

Comparative Example 1-2

Synthesis of Comparative Polymer 2

A 10-L flask equipped with a stirrer, thermometer, nitrogen purge line, and reflux condenser was charged with 212.0 g (0.80 mol) of Compound (S-4) and 78.4 g (0.20 mol) of Compound (S-5), then with 2,000 g of toluene, and heated at 70° C. Thereafter, 1.0 g of a chloroplatinic acid toluene solution (Pt concentration 0.5 wt %) was added, and 38.8 g (0.20 mol) of Compound (S-1) and 1268.0 g (0.80 mol) of Compound (S-2b) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Comparative Polymer 2. Comparative Polymer 2 had a Mw of 85,000 and a siloxane unit content of 79.4 wt %.

Comparative Example 1-3

Synthesis of Comparative Polymer 3

A 10-L flask equipped with a stirrer, thermometer, nitrogen purge line, and reflux condenser was charged with 431.2 g (0.80 mol) of Compound (S-3a) and 86.0 g (0.20 mol) of Compound (S-6), then with 2,000 g of toluene, and heated at 70° C. Thereafter, 1.0 g of a chloroplatinic acid toluene solution (Pt concentration 0.5 wt %) was added, and 174.6 g (0.90 mol) of Compound (S-1) and 158.5 g (0.10 mol) of Compound (S-2b) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Comparative Polymer 3. Comparative Polymer 3 had a Mw of 28,000 and a siloxane unit content of 18.6 wt %.

Comparative Example 1-4

Synthesis of Comparative Polymer 4

A 10-L flask equipped with a stirrer, thermometer, nitrogen purge line, and reflux condenser was charged with 654.4 g (0.80 mol) of Compound (S-3b) and 78.4 g (0.20 mol) of Compound (S-5), then with 2,000 g of toluene, and heated at 70° C. Thereafter, 1.0 g of a chloroplatinic acid toluene solution (Pt concentration 0.5 wt %) was added, and 174.6 g (0.90 mol) of Compound (S-1) and 302.0 g (0.10 mol) of Compound (S-2a) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Comparative Polymer 4. Comparative Polymer 4 had a Mw of 59,000 and a siloxane unit content of 25.0 wt %.

Comparative Example 1-5

Synthesis of Comparative Polymer 5

A 10-L flask equipped with a stirrer, thermometer, nitrogen purge line, and reflux condenser was charged with 215.0 g (0.50 mol) of Compound (S-6) and 196.0 g (0.50 mol) of Compound (S-5), then with 2,000 g of toluene, and heated at 70° C. Thereafter, 1.0 g of a chloroplatinic acid toluene solution (Pt concentration 0.5 wt %) was added, and 135.8 g (0.70 mol) of Compound (S-1) and 906.0 g (0.30 mol) of Compound (S-2a) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Comparative Polymer 5. Comparative Polymer 5 had a Mw of 93,000 and a siloxane unit content of 62.4 wt %.

Comparative Example 1-6

Synthesis of Comparative Polymer 6

A 10-L flask equipped with a stirrer, thermometer, nitrogen purge line, and reflux condenser was charged with 430.0 g (1.00 mol) of Compound (S-6), then with 2,000 g of toluene, and heated at 70° C. Thereafter, 1.0 g of a chloroplatinic acid toluene solution (Pt concentration 0.5 wt %) was added, and 155.2 g (0.80 mol) of Compound (S-1) and 604.0 g (0.20 mol) of Compound (S-2a) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Comparative Polymer 6. Comparative Polymer 6 had a Mw of 67,000 and a siloxane unit content of 50.8 wt %.

Comparative Example 1-7

Synthesis of Comparative Polymer 7

A 10-L flask equipped with a stirrer, thermometer, nitrogen purge line, and reflux condenser was charged with 392.0 g (1.00 mol) of Compound (S-5), then with 2,000 g of toluene, and heated at 70° C. Thereafter, 1.0 g of a chloroplatinic acid toluene solution (Pt concentration 0.5 wt %) was added, and 155.2 g (0.80 mol) of Compound (S-1) and 604.0 g (0.20 mol) of Compound (S-2a) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Comparative Polymer 7. Comparative Polymer 7 had a Mw of 100,000 and a siloxane unit content of 52.5 wt %.

Comparative Example 1-8

Synthesis of Comparative Polymer 8

A 10-L flask equipped with a stirrer, thermometer, nitrogen purge line, and reflux condenser was charged with 265.0 g (1.00 mol) of Compound (S-4), then with 2,000 g of toluene, and heated at 70° C. Thereafter, 1.0 g of a chloroplatinic acid toluene solution (Pt concentration 0.5 wt %)

was added, and 155.2 g (0.80 mol) of Compound (S-1) and 604.0 g (0.20 mol) of Compound (S-2a) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Comparative Polymer 8. Comparative Polymer 8 had a Mw of 70,000 and a siloxane unit content of 59.0 wt %.

(2) Light Transmission Test

Examples 2-1 to 2-6

A resin solution was prepared by dissolving each of Polymers 1 to 6 in cyclopentanone in a concentration of 50 wt %. The resin solution was coated onto a glass wafer and baked at 60° C. for 30 minutes and in nitrogen atmosphere at 190° C. for 2 hours, forming a resin film of 10 μm thick. Using a spectrophotometer U-3900H (Hitachi High-Tech Science Corp.), the film was measured for transmittance with respect to light of wavelength 405 nm. The results are shown in Table 1.

TABLE 1

| | Example | | | | | |
|---|---|---|---|---|---|---|
| | 2-1 Polymer 1 | 2-2 Polymer 2 | 2-3 Polymer 3 | 2-4 Polymer 4 | 2-5 Polymer 5 | 2-6 Polymer 6 |
| Light transmittance @ 405 nm (%) | 99 | 96 | 97 | 98 | 99 | 96 |

In an oven at 50° C., the sample (having a resin film on glass wafer as above) was continuously irradiated with laser radiation of wavelength 405 nm and power 1 W. Values of light transmittance after 100 hours and 1,000 hours of laser irradiation were determined. The results are shown in Table 2.

TABLE 2

| | Laser irradiation time | Example | | | | | |
|---|---|---|---|---|---|---|---|
| | | 2-1 Polymer 1 | 2-2 Polymer 2 | 2-3 Polymer 3 | 2-4 Polymer 4 | 2-5 Polymer 5 | 2-6 Polymer 6 |
| Light transmittance @ 405 nm (%) | 100 hr | 98 | 96 | 97 | 97 | 98 | 96 |
| | 1,000 hr | 97 | 95 | 96 | 96 | 97 | 95 |

Polymers 1 to 6 demonstrate that novel polymers containing polysiloxane, silphenylene, isocyanuric acid, and polyether skeletons in their backbone can be synthesized. The films of the siloxane polymers have high transparency and light resistance.

[2] Preparation and Evaluation of Photosensitive Resin Compositions

Examples 3-1 to 3-10 and Comparative Examples 2-1 to 2-19

(1) Preparation of Photosensitive Resin Compositions

Photosensitive resin compositions were prepared by combining Polymers 1 to 6 or Comparative Polymers 1 to 8 as component (A), photoacid generator B-1 or B-2 as component (B), crosslinker C-1, C-2 or C-3 as component (C), cyclopentanone (CP) as solvent (D), and antioxidant E-1 or E-2 as component (E) in accordance with the formulation shown in Tables 3 to 5, agitating them until dissolution, and precision filtering through a Teflon® filter with a pore size of 0.2 μm.

TABLE 3

| Component (pbw) | | | Example | | | | | | | | | |
|---|---|---|---|---|---|---|---|---|---|---|---|---|
| | | | 3-1 | 3-2 | 3-3 | 3-4 | 3-5 | 3-6 | 3-7 | 3-8 | 3-9 | 3-10 |
| (A) | Polymer | 1 | 100 | | | | | | 100 | | | |
| | | 2 | | 100 | | | | | | 100 | | |
| | | 3 | | | 100 | | | | | | 50 | |
| | | 4 | | | | 100 | | | | | 50 | |
| | | 5 | | | | | 100 | | | | | 50 |
| | | 6 | | | | | | 100 | | | | 50 |
| (B) | Photoacid generator | B-1 | 1 | | 1 | 1 | | | 1 | | | |
| | | B-2 | | 1 | | | 1 | 5 | | 1 | 2 | 2 |

TABLE 3-continued

| Component | | | 3-1 | 3-2 | 3-3 | 3-4 | 3-5 | 3-6 | 3-7 | 3-8 | 3-9 | 3-10 |
|---|---|---|---|---|---|---|---|---|---|---|---|---|
| | | | | | | | Example | | | | | |
| (C) | Crosslinker | C-1 | | 10 | | | | | | | 20 | |
| | | C-2 | | | 10 | 50 | | | | | | 10 |
| | | C-3 | | | | | | 1 | 1 | 20 | | 10 |
| (D) | Solvent | CP | 55 | 55 | 55 | 55 | 55 | 55 | 55 | 55 | 55 | 55 |
| (E) | Antioxidant | E-1 | | | | 0.1 | 0.1 | 0.1 | 0.1 | 0.1 | 0.1 | 0.1 |
| | | E-2 | | | | 0.1 | 0.1 | 0.1 | 0.1 | 0.1 | 0.1 | 0.1 |

TABLE 4

| Component | | | 2-1 | 2-2 | 2-3 | 2-4 | 2-5 | 2-6 | 2-7 | 2-8 | 2-9 | 2-10 | 2-11 |
|---|---|---|---|---|---|---|---|---|---|---|---|---|---|
| | | | | | | | Comparative Example | | | | | | |
| (A) | Polymer | 1 | 100 | | | | | | | | | | |
| | | 2 | | 100 | | | | | | | | | |
| | | 3 | | | 100 | | | | | | | | |
| | Comparative | 1 | | | | 100 | | | | | | | |
| | Polymer | 2 | | | | | 100 | | | | | | |
| | | 3 | | | | | | 100 | | | | | |
| | | 4 | | | | | | | 100 | | | | |
| | | 5 | | | | | | | | 100 | | | |
| | | 6 | | | | | | | | | 100 | | |
| | | 7 | | | | | | | | | | 100 | |
| | | 8 | | | | | | | | | | | 100 |
| (B) | Photoacid | B-1 | | | | 1 | 1 | 1 | 1 | | | | |
| | generator | B-2 | | | | | | | | 1 | 1 | 1 | 1 |
| (C) | Crosslinker | C-1 | | 20 | | | | | | | | | |
| | | C-2 | | | | | | | | | | | |
| | | C-3 | | | | | | | | | | | |
| (D) | Solvent | CP | 55 | 55 | 55 | 55 | 55 | 55 | 55 | 55 | 55 | 55 | 55 |
| (E) | Antioxidant | E-1 | | | 0.1 | | | | | | | | |
| | | E-2 | | | 0.1 | | | | | | | | |

TABLE 5

| Component | | | 2-12 | 2-13 | 2-14 | 2-15 | 2-16 | 2-17 | 2-18 | 2-19 |
|---|---|---|---|---|---|---|---|---|---|---|
| | | | | | | Comparative Example | | | | |
| (A) | Comparative | 1 | 100 | | | | | | | |
| | Polymer | 2 | | 100 | | | | | | |
| | | 3 | | | 100 | | | | | |
| | | 4 | | | | 100 | | | | |
| | | 5 | | | | | 100 | | | |
| | | 6 | | | | | | 100 | | |
| | | 7 | | | | | | | 100 | |
| | | 8 | | | | | | | | 100 |
| (B) | Photoacid | B-1 | | | | | 3 | 3 | 3 | 3 |
| | generator | B-2 | 3 | 3 | 3 | 3 | | | | |
| (C) | Crosslinker | C-1 | | 10 | | | 50 | | | 10 |
| | | C-2 | | | 10 | | | 50 | | 10 |
| | | C-3 | | | | 10 | | | 50 | |
| (D) | Solvent | CP | 55 | 55 | 55 | 55 | 55 | 55 | 55 | 55 |
| (E) | Antioxidant | E-1 | 0.1 | 0.1 | 0.1 | 0.1 | 0.1 | 0.1 | 0.1 | 0.1 |
| | | E-2 | 0.1 | 0.1 | 0.1 | 0.1 | 0.1 | 0.1 | 0.1 | 0.1 |

Photoacid generators B-1 and B-2, crosslinkers C-1 to C-3, antioxidants E-1 and E-2 are identified below.
Photoacid Generator B-1
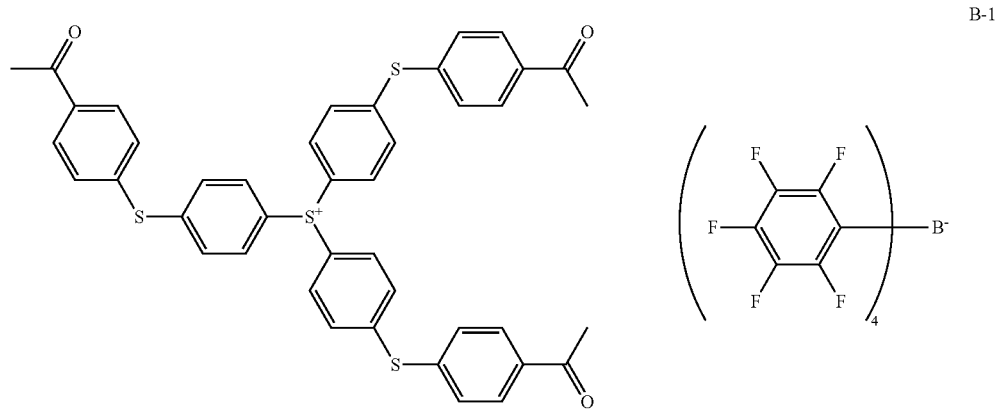
Photoacid Generator B-2: CPI-210S by San-Apro Ltd.
Crosslinkers C-1, C-2, C-3
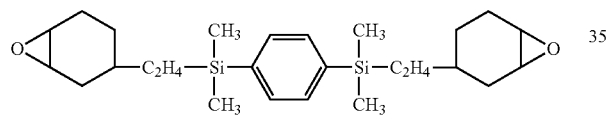
-continued
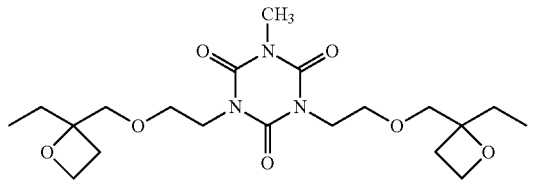
Antioxidant E-1: Chimassorb 119FL (BASF)
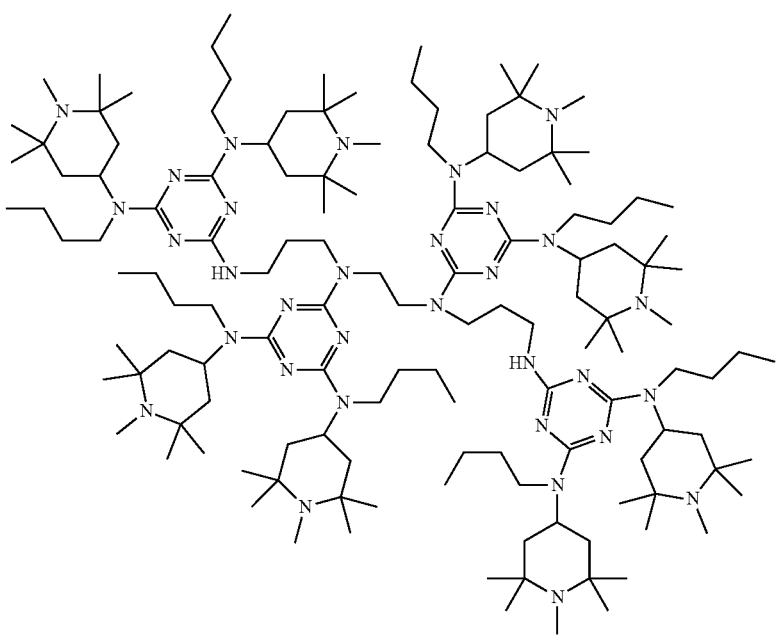

Antioxidant E-2: Irganox 3114 (BASF)

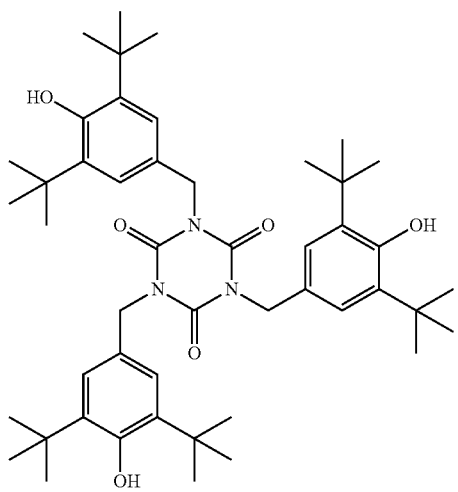

(2) Evaluation of Pattern Formation

Using a spin coater, each photosensitive resin composition was coated onto a 8-inch silicon wafer, which had been primed with hexamethyldisilazane (HMDS), so as to form a film of 10 μm thick. The coated wafer was placed on a hotplate and heat dried at 110° C. for 3 minutes in order to remove the solvent from the composition. Using a contact aligner type exposure system, the photosensitive resin film was exposed to radiation of 365 nm through a mask adapted to form a line-and-space pattern and contact hole pattern. The resin film was post-exposure baked (PEB) on a hotplate at 120° C. for 3 minutes and then cooled. The resin film was developed by spraying PGMEA for 300 seconds, forming patterns.

The photosensitive resin film on the wafer which had been patterned as above was post-cured in an oven where the film was heated at 190° C. for 2 hours while purging the oven with nitrogen. Under a scanning electron microscope (SEM), the resulting contact hole patterns of 50 μm, 30 μm, 20 μm, 10 μm and 5 μm were observed in cross section. The minimum hole pattern in which holes penetrated through the film to the bottom was reported as maximum resolution. In view of the cross-sectional photo, the contact hole pattern of 50 μm was evaluated for perpendicularity. The resin film was rated "Excellent" for perpendicular profile, "Good" for slightly reverse tapered profile, "Fair" for reverse tapered profile, and "NG" for opening failure. The results are shown in Tables 6 to 8.

TABLE 8

|  | Comparative Example | | | | | | | |
|---|---|---|---|---|---|---|---|---|
|  | 2-12 | 2-13 | 2-14 | 2-15 | 2-16 | 2-17 | 2-18 | 2-19 |
| Resin film thickness (μm) | 10 | 10 | 10 | 10 | 10 | 10 | 10 | 10 |
| Contact hole pattern profile | Fair | Fair | Fair | Fair | Fair | Fair | Fair | Fair |
| Maximum resolution (μm) | 50 | 50 | 50 | 50 | 50 | 50 | 50 | 50 |

(3) Light Transmission Test 1

Using a spin coater, each photosensitive resin composition was coated onto a 8-inch glass wafer so as to form a resin film of 20 μm thick. The coated wafer was placed on a hotplate and heat dried at 110° C. for 3 minutes in order to remove the solvent from the composition.

Using a Mask Aligner MA8 (SUSS MicroTec AG), the film on the glass wafer was exposed over its entire surface to light of wavelength 360 nm from a high-pressure mercury lamp directly, i.e., not through a mask (flood exposure). The film was PEB and dipped in PGMEA. The film which remained after these operations was then heated in an oven at 190° C. for 2 hours, yielding a cured film. Using a spectrophotometer U-3900H (Hitachi High-Tech Science Corp.), the cured film was measured for transmittance of light of wavelength 405 nm. The results are shown in Tables 9 to 11.

TABLE 9

|  | Example | | | | | | | | | |
|---|---|---|---|---|---|---|---|---|---|---|
|  | 3-1 | 3-2 | 3-3 | 3-4 | 3-5 | 3-6 | 3-7 | 3-8 | 3-9 | 3-10 |
| Light transmittance @ 405 nm (%) | 97 | 97 | 97 | 99 | 99 | 99 | 99 | 99 | 99 | 99 |

TABLE 10

|  | Comparative Example | | | | | | | | | | |
|---|---|---|---|---|---|---|---|---|---|---|---|
|  | 2-1 | 2-2 | 2-3 | 2-4 | 2-5 | 2-6 | 2-7 | 2-8 | 2-9 | 2-10 | 2-11 |
| Light transmittance @ 405 nm (%) | 97 | 97 | 97 | 94 | 93 | 94 | 93 | 93 | 92 | 93 | 95 |

TABLE 6

|  | Example | | | | | | | | | |
|---|---|---|---|---|---|---|---|---|---|---|
|  | 3-1 | 3-2 | 3-3 | 3-4 | 3-5 | 3-6 | 3-7 | 3-8 | 3-9 | 3-10 |
| Resin film thickness (μm) | 10 | 10 | 10 | 10 | 10 | 10 | 10 | 10 | 10 | 10 |
| Contact hole pattern profile | Good | Good | Good | Excellent | Excellent | Excellent | Excellent | Excellent | Excellent | Excellent |
| Maximum resolution (μm) | 10 | 10 | 5 | 5 | 5 | 5 | 5 | 5 | 5 | 5 |

TABLE 7

|  | Comparative Example | | | | | | | | | | |
|---|---|---|---|---|---|---|---|---|---|---|---|
|  | 2-1 | 2-2 | 2-3 | 2-4 | 2-5 | 2-6 | 2-7 | 2-8 | 2-9 | 2-10 | 2-11 |
| Resin film thickness (μm) | 10 | 10 | 10 | 10 | 10 | 10 | 10 | 10 | 10 | 10 | 10 |
| Contact hole pattern profile | NG | NG | NG | Fair | Fair | NG | Fair | Fair | NG | Fair | Fair |
| Maximum resolution (μm) | — | — | — | 50 | 50 | — | 50 | 50 | — | 50 | 50 |

TABLE 11

| | Comparative Example | | | | | | | |
|---|---|---|---|---|---|---|---|---|
| | 2-12 | 2-13 | 2-14 | 2-15 | 2-16 | 2-17 | 2-18 | 2-19 |
| Light transmittance @ 405 nm (%) | 94 | 92 | 94 | 94 | 94 | 93 | 94 | 95 |

(4) Light Transmission Test 2

In an oven at 150° C., the sample in the form of the resin film on glass wafer, prepared as in (3) Light transmission test 1, was continuously irradiated with laser radiation of wavelength 405 nm and power 1 W. A change of transmittance after 2,000 hours of laser irradiation at 405 nm was determined, provided that the initial transmittance was 100%.

The results are shown in Tables 12 to 14.

TABLE 12

| | Example | | | | | | | | | |
|---|---|---|---|---|---|---|---|---|---|---|
| | 3-1 | 3-2 | 3-3 | 3-4 | 3-5 | 3-6 | 3-7 | 3-8 | 3-9 | 3-10 |
| Light transmittance after laser irradiation @ 405 nm (%) | 96 | 96 | 96 | 99 | 99 | 99 | 99 | 99 | 99 | 99 |

TABLE 13

| | Comparative Example | | | | | | | | | | |
|---|---|---|---|---|---|---|---|---|---|---|---|
| | 2-1 | 2-2 | 2-3 | 2-4 | 2-5 | 2-6 | 2-7 | 2-8 | 2-9 | 2-10 | 2-11 |
| Light transmittance after laser irradiation @ 405 nm (%) | 92 | 91 | 92 | 78 | 72 | 77 | 82 | 80 | 81 | 75 | 90 |

TABLE 14

| | Comparative Example | | | | | | | |
|---|---|---|---|---|---|---|---|---|
| | 2-12 | 2-13 | 2-14 | 2-15 | 2-16 | 2-17 | 2-18 | 2-19 |
| Light transmittance after laser irradiation @ 405 nm (%) | 81 | 76 | 76 | 75 | 75 | 73 | 81 | 90 |

(5) Evaluation of Reliability (Adhesion and Crack Resistance)

By operating a dicing saw with a dicing blade (DAD685 by DISCO Corp.) at a spindle revolution of 40,000 rpm and a cutting speed of 20 mm/sec, the wafer bearing the photosensitive resin film which had been prepared as in (3) Light transmission test 1 was diced into square pieces (test samples) of 10 mm×10 mm. Ten test samples (for each Example) were subjected to a thermal cycling test of repeating 2,000 cycles of holding at −25° C. for 10 minutes and holding at 125° C. for 10 minutes. After the thermal cycling test, it was inspected whether or not the resin film peeled from the wafer and whether or not the resin film cracked. The set of samples is rated "OK" when no samples peeled or cracked, "peeled" when one or more samples peeled, and "cracked" when one or more samples cracked. The results are shown in Tables 15 to 17.

TABLE 15

| | Example | | | | | | | | | |
|---|---|---|---|---|---|---|---|---|---|---|
| | 3-1 | 3-2 | 3-3 | 3-4 | 3-5 | 3-6 | 3-7 | 3-8 | 3-9 | 3-10 |
| Reliability | OK | OK | OK | OK | OK | OK | OK | OK | OK | OK |

TABLE 16

| | Comparative Example | | | | | | | | | | |
|---|---|---|---|---|---|---|---|---|---|---|---|
| | 2-1 | 2-2 | 2-3 | 2-4 | 2-5 | 2-6 | 2-7 | 2-8 | 2-9 | 2-10 | 2-11 |
| Reliability | cracked peeled | cracked peeled | cracked peeled | cracked peeled | cracked peeled | cracked peeled | cracked peeled | cracked peeled | cracked peeled | cracked peeled | cracked peeled |

TABLE 17

| | Comparative Example | | | | | | | |
|---|---|---|---|---|---|---|---|---|
| | 2-12 | 2-13 | 2-14 | 2-15 | 2-16 | 2-17 | 2-18 | 2-19 |
| Reliability | cracked peeled | cracked peeled | cracked peeled | cracked peeled | cracked peeled | cracked peeled | cracked peeled | cracked peeled |

As is evident from the results, the photosensitive resin compositions within the scope of the invention form films (or coatings) which can be processed into a fine size pattern, indicating satisfactory properties as photosensitive material. In addition, the films have high light transmission, satisfactory light resistance and reliability (adhesion, crack resistance) and are thus useful as a material for photo-semiconductor devices.

Japanese Patent Application Nos. 2018-221908 and 2019-084933 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A siloxane polymer comprising a polysiloxane skeleton, silphenylene skeleton, isocyanuric acid skeleton, and polyether skeleton in a backbone and having an epoxy group in a side chain, wherein the polymer comprises repeating units having the following formulae (A1) to (A4):

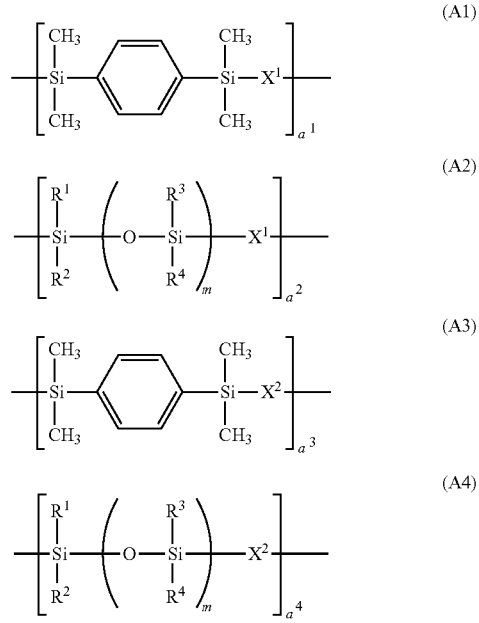

wherein $R^1$ to $R^4$ are each independently a $C_1$-$C_{20}$ monovalent hydrocarbon group which may contain a heteroatom, m is each independently an integer of 1 to 600, with the proviso that when m is an integer of at least 2, groups $R^3$ may be identical or different and groups $R^4$ may be identical or different, $a^1$, $a^2$, $a^3$, and $a^4$ are numbers in the range: $0<a^1<1$, $0<a^2<1$, $0<a^3<1$, $0<a^4<1$, and $a^1+a^2+a^3+a^4=1$, $X^1$ is a divalent group having the formula (X1):

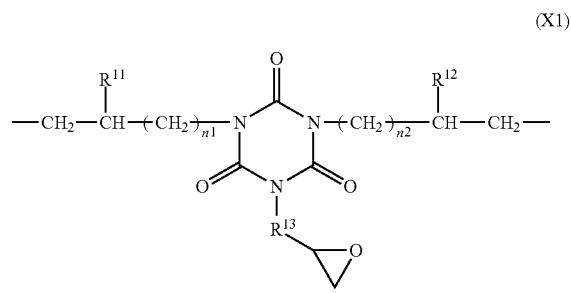

wherein $R^{11}$ and $R^{12}$ are each independently hydrogen or methyl, $n^1$ and $n^2$ are each independently an integer of 0 to 7, $R^{13}$ is a $C_1$-$C_8$ divalent hydrocarbon group in which an ester bond or ether bond may intervene between carbon atoms, and $X^2$ is a divalent group having the formula (X2):

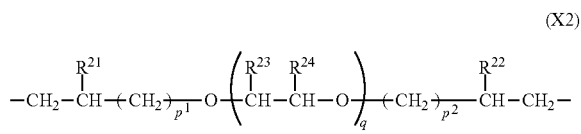

wherein $R^{21}$ and $R^{22}$ are each independently hydrogen or a $C_1$-$C_8$ monovalent hydrocarbon group, $R^{23}$ and $R^{24}$ are each independently hydrogen or methyl, $p^1$ and $p^2$ are each independently an integer of 1 to 6, and q is an integer of 0 to 100.

2. The polymer of claim 1 wherein a film of the polymer having a thickness of 10 μm has a transmittance of at least 97% with respect to light of wavelength 405 nm.

3. The polymer of claim 1 wherein q is an integer of 5 to 20.

4. The polymer of claim 1 wherein m is an integer of 10 to 100.

5. The polymer of claim 1 wherein $R^{11}$, $R^{12}$, $R^{21}$ and $R^{22}$ are hydrogen.

6. The polymer of claim 1, having a weight average molecular weight of 3,000 to 500,000.

7. A photosensitive resin composition comprising (A) the siloxane polymer of claim 1 and (B) a photoacid generator.

8. The photosensitive resin composition of claim 7 wherein component (B) is present in an amount of 0.05 to 20 parts by weight per 100 parts by weight of component (A).

9. The photosensitive resin composition of claim 7, further comprising (C) a cationic polymerizable crosslinker.

10. The photosensitive resin composition of claim 7, further comprising (D) a solvent.

11. The photosensitive resin composition of claim 7, further comprising (E) an antioxidant.

12. A pattern forming process comprising the steps of:
(i) applying the photosensitive resin composition of claim 7 onto a substrate to form a photosensitive resin film thereon,
(ii) exposing the photosensitive resin film to radiation, and
(iii) developing the exposed resin film in a developer.

13. A method for fabricating an opto-semiconductor device involving the pattern forming process of claim 12, the device comprising the patterned photosensitive resin film.

14. The polymer of claim 1 wherein the polyether skeleton is represented by the formula (X2):

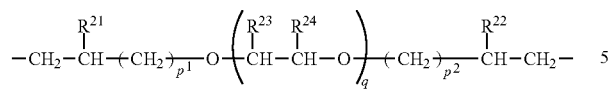
wherein $R^{21}$ and $R^{22}$ are each independently hydrogen or a $C_1$-$C_8$ monovalent hydrocarbon group, $R^{23}$ and $R^{24}$ are each independently hydrogen or methyl, $p^1$ and $p^2$ are each independently an integer of 1 to 6, and q is an integer of 0 to 100.
* * * * *